(12) United States Patent
Weekly

(10) Patent No.: US 7,050,478 B1
(45) Date of Patent: May 23, 2006

(54) APPARATUS AND METHOD FOR SYNCHRONIZING CLOCK MODULATION WITH POWER SUPPLY MODULATION IN A SPREAD SPECTRUM CLOCK SYSTEM

(75) Inventor: Roger Donell Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1076 days.

(21) Appl. No.: 09/631,716

(22) Filed: Aug. 3, 2000

(51) Int. Cl.
*H03C 3/09* (2006.01)
*H03L 7/06* (2006.01)

(52) U.S. Cl. .................. 375/130; 327/101; 327/143
(58) Field of Classification Search ................ 323/281, 323/282, 299, 351, 222; 395/750.03, 556, 395/750.08; 380/200–255; 455/42–45; 375/376, 130, 200, 375; 713/322, 300, 501; 364/707; 331/143; 327/102, 149, 158, 161, 327/535, 538, 540, 101, 143; 709/100
See application file for complete search history.

(56) References Cited

U.S. PATENT DOCUMENTS

| 5,307,003 A | | 4/1994 | Fairbanks et al. |
| 5,627,412 A | * | 5/1997 | Beard .......................... 307/82 |
| 5,630,110 A | * | 5/1997 | Mote, Jr. ..................... 713/501 |
| 5,684,392 A | | 11/1997 | Chang et al. |
| 5,736,893 A | * | 4/1998 | Puckette et al. ............ 327/551 |
| 5,760,636 A | | 6/1998 | Noble et al. |
| 5,778,237 A | | 7/1998 | Yamamoto et al. |
| 5,787,294 A | * | 7/1998 | Evoy .......................... 713/320 |

(Continued)

OTHER PUBLICATIONS

Spread spectrum clock generation for the reduction of radiated emissions Hardin, K.B.; Fessler, J.T.; Bush, D.R.; Electromagnetic Compatibility, 1994. Symposium Record. Compatibility in the Loop. IEEE International Symposium on, 22-26.*

(Continued)

*Primary Examiner*—Jay K. Patel
*Assistant Examiner*—Jacob Meek
(74) *Attorney, Agent, or Firm*—Mark E. McBurney; Russell D. Culbertson; The Culbertson Group, P.C.

(57) ABSTRACT

A spread spectrum clock system (11) modulates the supply voltage for a circuit (10) in concert with the circuit clock frequency (C). The system increases the supply voltage for the circuit (10) in phase with increases in the circuit clock frequency (C). However, in the portion of the clock frequency modulation period in which the clock frequency (C) is decreasing, the system (11) also decreases the supply voltage for the circuit (10). This relationship between the circuit supply voltage and circuit clock frequency (C) may be accomplished by modulating the output (18) of a power supply (15) for the circuit (10) and applying that modulated supply voltage signal through a signal translator (30) to control modulation of a clock source (14).

10 Claims, 3 Drawing Sheets

U.S. PATENT DOCUMENTS

| | | | | |
|---|---|---|---|---|
| 5,812,860 | A * | 9/1998 | Horden et al. | 713/322 |
| 5,872,807 | A * | 2/1999 | Booth et al. | 375/130 |
| 5,943,382 | A * | 8/1999 | Li et al. | 375/376 |
| 6,141,762 | A * | 10/2000 | Nicol et al. | 713/300 |
| 6,366,157 | B1 * | 4/2002 | Abdesselem et al. | 327/535 |
| 6,377,646 | B1 * | 4/2002 | Sha | 375/376 |
| 6,424,184 | B1 * | 7/2002 | Yamamoto et al. | 327/102 |
| 6,425,086 | B1 * | 7/2002 | Clark et al. | 713/322 |

OTHER PUBLICATIONS

A frequency modulated PLL for EMI reduction in embedded application Michel, J.-Y.; Neron, C.; ASIC/SOC Conference, 1999. Proceedings. Twelfth Annual IEEE International, 15-18 Sep. 1999.*

English language translation of abstract of Japanese Patent No. JP5073166A2, Published Mar. 26, 1993.

* cited by examiner

APPARATUS AND METHOD FOR SYNCHRONIZING CLOCK MODULATION WITH POWER SUPPLY MODULATION IN A SPREAD SPECTRUM CLOCK SYSTEM

TECHNICAL FIELD OF THE INVENTION

The invention relates to electronic circuits that use high frequency clock signals. More particularly, the invention relates to an apparatus and method for modulating the supply voltage to a circuit along with the clock frequency in a spread spectrum clock arrangement.

BACKGROUND OF THE INVENTION

The high frequency clock signals used in many electronic circuits generate coincidental electromagnetic fields. These coincidental electromagnetic fields or emissions are known as electromagnetic interference or "EMI. "The energy of EMI emissions from a particular circuit is directly proportional to the frequency of the clock signal used in the circuit.

EMI emissions from electronic devices are regulated by governmental or other agencies to certain maximum allowable limits. Electronic equipment manufacturers must reduce EMI emissions as much as possible in order to maintain these emissions within the allowable limits. For example, electronic circuits may be enclosed in special electrically conductive housings which block or shield EMI emissions from the enclosed circuit. However, as clock frequencies increase, complete EMI shielding becomes more difficult, and EMI emission levels may increase.

Many regulatory EMI limits are set as a maximum average emission energy level over an operating period for the circuit. Reducing clock frequency in a circuit for a portion of an operating period reduces the average energy of EMI emissions over the operating period. Thus, it is sometimes possible to meet regulatory limits for EMI emissions from a particular circuit by modulating the clock frequency in the circuit within a certain range about a centerline or nominal clock frequency. This modulated clock signal frequency in an electronic circuit is commonly referred to as a spread spectrum clock signal.

All processors and other electronic devices that operate under control of a clock signal are limited in the clock frequency they can support, and thus the speed at which they can process data. This operational speed limit is the result of certain critical paths between functional blocks which are clocked by a common clock signal. The maximum time it takes to launch data from one circuit functional block, transmit it to a receiving circuit functional block, and arrive at the receiving circuit functional block prior to the setup time required by the receiving circuit functional block, determines the minimum instantaneous cycle time that may be allowed for a clock signal in an electronic device which includes the two functional blocks. This minimum instantaneous cycle time translates to a maximum clock frequency for the circuit and can never be violated without running the risk that the circuit will produce incorrect results for a given input. Where the clock frequency for a circuit is modulated in a spread spectrum clock arrangement, the modulated frequency must be controlled so that the instantaneous frequency at any given time remains below the maximum allowable clock frequency supported by the circuit.

Minimum cycle time may be improved or reduced in many circuits by increasing the supply voltage in the circuit. Thus, the maximum allowable instantaneous frequency in a spread spectrum clock signal may be increased simply by increasing the supply voltage to the circuit. However, increasing the supply voltage in a circuit will increase power dissipation in the circuit, and the thermal effect of this increased power dissipation may have a detrimental impact on the functionality and reliability of the circuit. Thus, in many systems, increasing supply voltage level is not a viable choice to meet limitations on the maximum instantaneous frequency in a spread spectrum clock system.

SUMMARY OF THE INVENTION

It is an object of the invention to provide an apparatus and method for providing a spread spectrum clock signal in a manner which facilitates increased circuit performance.

This object is accomplished by modulating the supply voltage for a circuit in concert or synchronization with the circuit clock frequency. According to the present invention, the supply voltage for a circuit is increased as clock frequency is increased. However, in the portion of the clock frequency modulation cycle in which the clock frequency is decreasing, the supply voltage for the circuit is also decreased. This modulation of the circuit supply voltage level in concert with the system clock frequency provides the reduced EMI emission levels desired in spread spectrum clock arrangements, and simultaneously allows the circuit to function periodically at higher clock frequencies to improve overall system performance.

The relative modulation in circuit supply voltage level and clock frequency according to the invention may be accomplished in a number of different fashions. In one form of the invention a modulator is operatively connected to apply a first modulation to the supply voltage for a circuit. A corresponding modulating arrangement uses the modulated supply voltage signal to control a corresponding modulation in the clock frequency for the circuit. Alternatively, a modulation signal source may be used directly to control both the modulation of the system clock frequency and the circuit supply voltage level. Regardless of the particular circuit structure used to effect the relative supply voltage and clock frequency modulation, the method of the invention includes the steps of modulating one of the circuit supply voltage or the system clock signal frequency at a first modulation frequency and modulating the other one of the supply voltage or clock frequency at a corresponding modulation frequency.

As used in this disclosure and the accompanying claims, a first modulation is a "corresponding modulation" with respect to a second modulation when the peaks of the first modulation waveform coincide at least partially with the peaks of the second modulation waveform. In some preferred forms of the invention, the supply voltage and clock frequency are modulated so that the resulting two modulation waveforms are generally identical. However, the clock frequency modulation need not coincide identically with the supply voltage modulation to provide increased system performance and to fall within the scope of the invention and the accompanying claims. That is, the two modulation waveforms (instantaneous frequency and supply voltage level plotted over time) may be unequal and still provide benefits according to the invention.

These and other objects, advantages, and features of the invention will be apparent from the following description of the preferred embodiments, considered along with the accompanying drawings.

DESCRIPTION OF THE PREFERRED EMBODIMENTS

Figure 1:
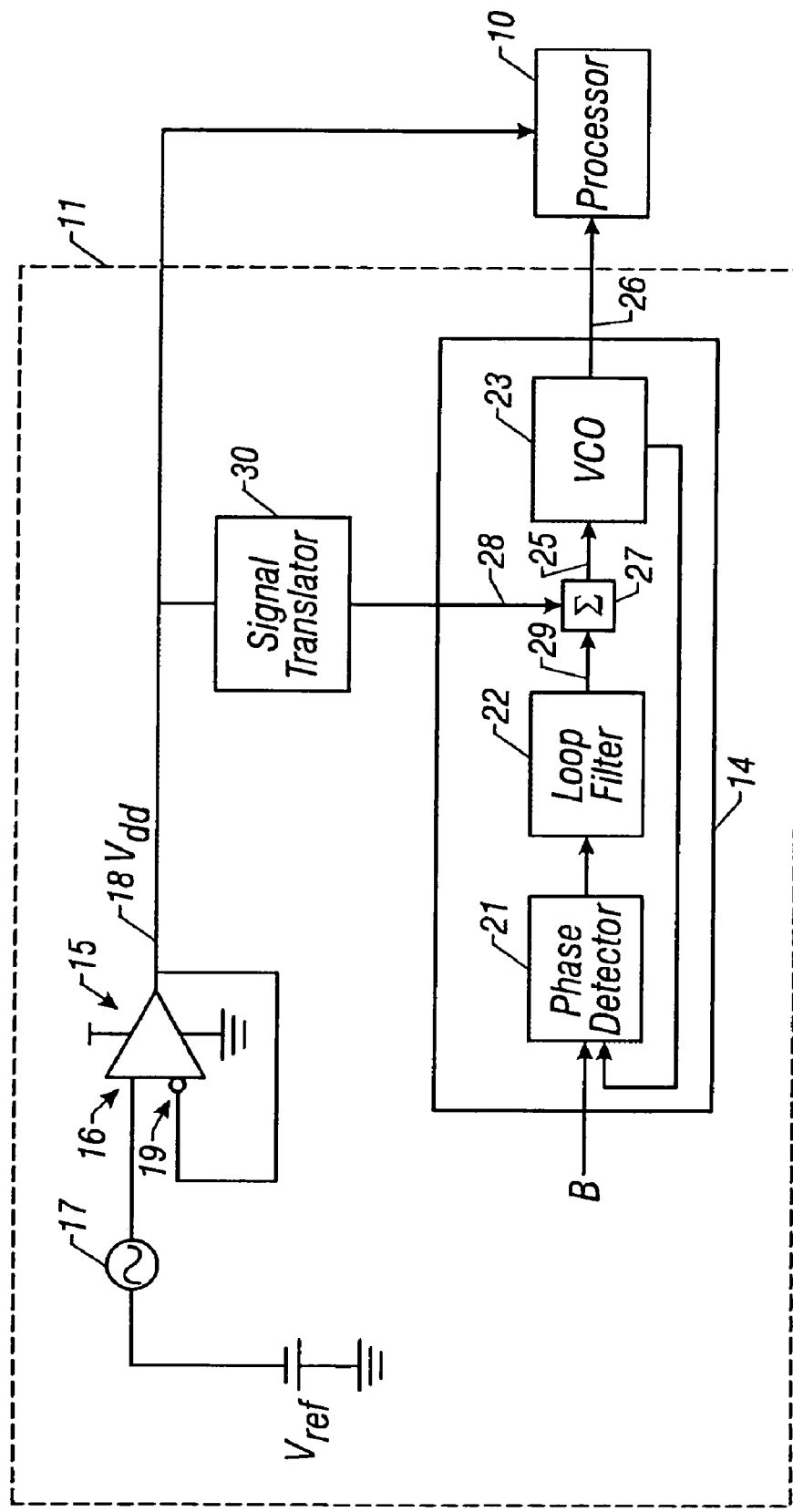
FIG. 1 is a diagrammatic representation of a spread spectrum clock system embodying the principles of the invention.

FIG. 1 illustrates electronic circuit 10 utilizing a spread spectrum clock system 11 embodying the principles of the invention. Circuit 10 is shown in the figure as a processor, but may comprise any circuit utilizing a DC supply voltage signal and a spread spectrum clock signal. Although, circuit 10 may be implemented as a separate integrated circuit chip which receives a DC supply voltage signal and the system clock from off-chip sources, the circuit may alternatively be implemented together with the spread spectrum clock system on a single integrated circuit chip. Also, circuit 10 and spread spectrum clock system 11 may be implemented using discrete electronic components within the scope of the following claims.

Spread spectrum clock system 11 includes a spread spectrum clock source 14 and a power supply 15. Clock source 14 provides the clock signal for circuit 10, while power supply 15 provides the supply voltage signal $V_{dd}$ for the circuit. As used in this disclosure and the accompanying claims, "supply voltage signal" refers to the voltage signal supplied to and distributed throughout circuit 10 to provide the electrical energy required to operate the various components of the circuit. Also, "clock signal" refers to the signal comprising a suitable clock waveform which is supplied to circuit 10 and distributed throughout the circuit to clock or coordinate the operation of various components in the circuit.

Power supply 15 is illustrated in FIG. 1 as a operational amplifier. The non-inverting or first input 16 to the operational amplifier is connected to receive a DC reference voltage signal modulated through modulator 17. Modulator 17 may comprise any suitable modulating arrangement including a saw-tooth or digital waveform generator. The power supply output at node 18 carries the supply voltage signal $V_{dd}$ which is applied to circuit 10. This signal is also fed back to the inverting input 19 of the operational amplifier.

Although the power supply 15 is shown as an operational amplifier in FIG. 1, it will be appreciated that the invention may be implemented using any suitable power supply arrangement. A suitable power supply for purposes of this invention and the accompanying claims comprises any power supply in which the output supply voltage may be modulated. Even in the operational amplifier arrangement shown in FIG. 1, filters and other signal conditioning arrangements may be included with the power supply. These additional components which may be included in the power supply 15 are omitted from the figures so as not to obscure the invention in unnecessary detail.

Spread spectrum clock source 14 shown in FIG. 1 comprises a phase lock loop (PLL) arrangement including a phase detector 21, loop filter 22, and voltage controlled oscillator (VCO) 23. A divider may be included in the feedback path of the PLL circuit, but is omitted from FIG. 1 in order to simplify the drawing. A summing method 27 is also included in the PLL clock source in this preferred form of the invention. The PLL clock source receives an oscillator or base frequency input B and a modulation input at 28. Base frequency B is applied as one input to phase detector 21 and provides a reference to which the clock source output signal at node 26 may be locked. The signal at modulation input 28 is summed as indicated by summing method 27 to produce a modulated signal at an input 25 to VCO 23. This modulated signal modulates the frequency of the clock signal output 26 so that the clock frequency varies within a certain range about a center or nominal frequency. It should be noted that if modulation input 28 to summing method 27 is zero, then the signal at VCO input 25 is identical to that of the output 29 from loop filter 22, as would be the case for a conventional PLL clock source.

A PLL clock source is shown in FIG. 1 only for purposes of example. It will be appreciated that the invention is not limited to this particular type of clock source. The invention encompasses any clock source in which the output clock signal may be modulated within a desired frequency range.

In the preferred form of the invention illustrated in FIG. 1, the modulated supply voltage signal at power supply output node 18 is applied to control the modulation of the clock frequency. Since the supply signal will normally be different from the voltage level required as the modulation input 28 to clock source 14, FIG. 1 includes a signal translator 30. Signal translator 30 receives the supply voltage signal from power supply output node 18 and translates that signal to form a suitable modulation input 28, that is, a modulation signal suitable for summing method 27 to combine with output 29 from loop filter 22. In the preferred form of the invention illustrated in FIG. 1, summing method 27 may be effected by a combination of the signal translator 30 and loop filter 22 rather than as a separate summing device. Any suitable summing arrangement may be employed to effect summing method 27 within the scope of the present invention.

The operation of the spread spectrum clock system 11 shown in FIG. 1 and the method of the invention may be described with reference to FIG. 1 and the timing diagram shown in FIG. 2. The method of the invention includes modulating both the supply voltage signal and the clock signal frequency (at 18 and 26, respectively, in FIG. 1) in concert or synchronization with each other at corresponding modulation frequencies. In the form of invention shown in FIG. 1, the step of modulating the supply voltage is accomplished using modulator 17 to modulate the reference voltage signal to the non-inverting input 16. This produces the modulated supply voltage signal $V_{dd}$ shown in FIG. 2.

The step of modulating the frequency of the clock source output at 26 in FIG. 1 is accomplished using the modulated supply voltage signal. More particularly, the supply voltage signal at node 18 is conditioned through signal translator 30 and then summed with output 29 from loop filter 22 by summing method 27. This summing function modulates the VCO input signal 25 to effect a modulation of the clock source output 26. This modulation based on the modulated supply voltage signal produces the modulated clock frequency shown at C in FIG. 2.

Figure 2:
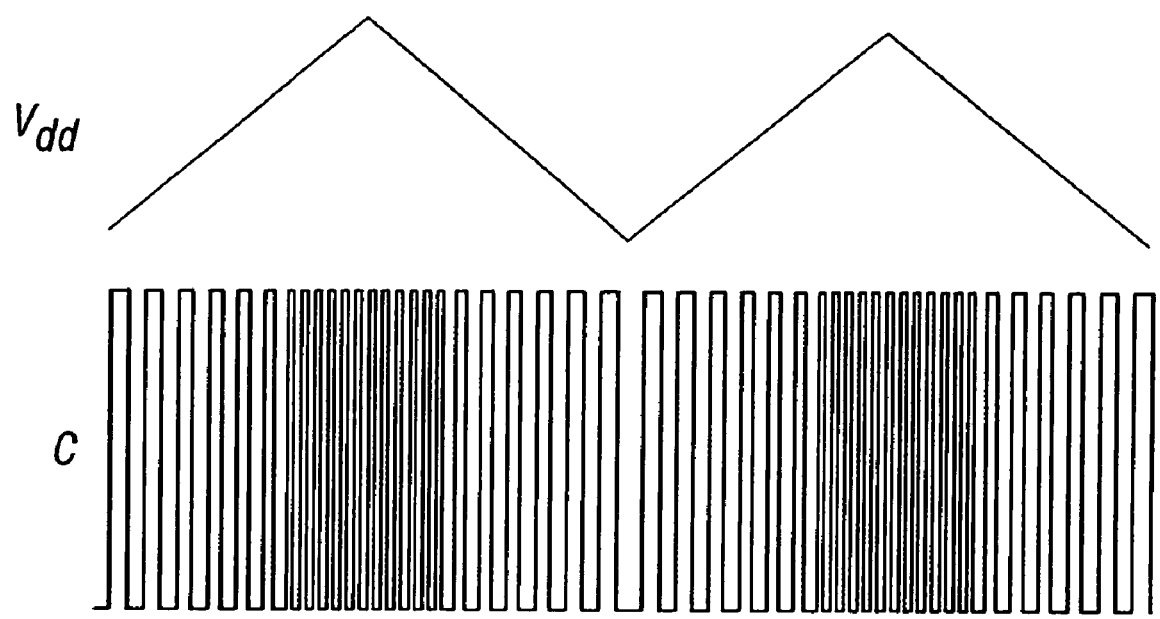
FIG. 2 is a representational timing diagram illustrating the relative modulation of circuit supply voltage and clock frequency according to the invention.

FIG. 2 illustrates that the modulation of the supply voltage signal $V_{dd}$ according to the invention corresponds with the modulated clock frequency. When the supply voltage signal $V_{dd}$ is at its highest level, the clock frequency C is also at its highest level. On the other hand, when the supply voltage $V_{dd}$ is lowest, the clock frequency C is also at its lowest level.

This relationship between the modulated supply voltage $V_{dd}$ and modulated clock frequency C produces several benefits. First, the modulated clock frequency causes circuit 10 to produce a lower average EMI emission energy over a given operating period. Second, the higher performance exhibited by circuit 10 at the higher supply voltage will support the higher clock frequency at the appropriate time in the spread spectrum cycle, and the lower voltage supplied during the slower clock frequency will help keep the power dissipation in the circuit down to acceptable levels.

For example, assume a 2.5% clock frequency spread spectrum modulation is desired in order to reduce EMI emissions for a particular circuit or system. In this case, a supply voltage modulation peak of only 2.1% over the nominal (center) supply voltage level will support the same performance level as a system without the spread spectrum clock and with the nominal supply voltage. This 2.1% supply voltage modulation peak represents half of the 2.5% peak-to-peak frequency modulation divided by the approximately 0.6% change in the maximum supportable clock frequency per % change in the supply voltage $V_{dd}$. The increased performance level in this example is achieved at less than a 0.3% increase in power dissipation. The semiconductor device junction added temperature rise in the circuit would be less than 0.2 degrees Celsius.

Figure 3:
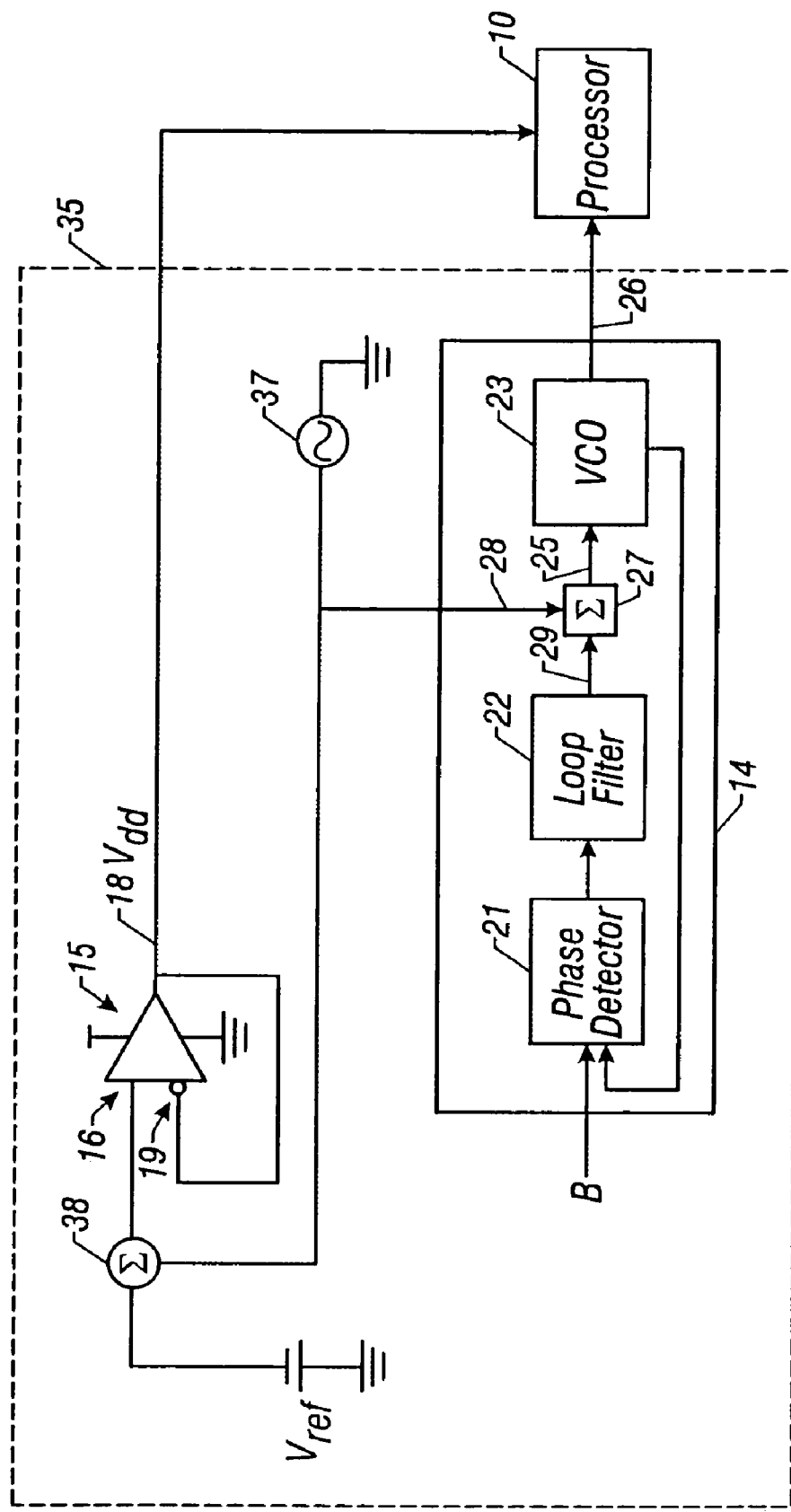
FIG. 3 is a diagrammatic representation of an alternate spread spectrum clock system embodying the principles of the invention.

FIG. 3 shows another preferred spread spectrum clock system 35 according to the invention. System 35 includes the same power supply 15 and clock source 14 to provide the supply voltage and system clock, respectively, to circuit 10. However, in this alternate form of the invention the modulation input 28 to clock source 14 is provided directly from a modulation signal source 37. The output from modulation signal source 37 is summed with the reference voltage $V_{ref}$ at summing junction 38 and applied to the non-inverting input 16 of the operational amplifier making up power supply 15.

It will be noted from FIG. 1 that modulator 17 cooperates with power supply 15 shown in FIG. 1 to provide an arrangement for modulating the supply voltage. The supply voltage signal $V_{dd}$ and signal translator 30 make up a corresponding modulation arrangement in FIG. 1 for modulating the spread spectrum clock frequency. In contrast, modulation signal source 37 in FIG. 3 operates as the modulating arrangement for modulating the clock frequency from clock source 14, while summing arrangement 38 cooperates with power supply 15 to provide a corresponding modulating arrangement to modulate the supply voltage.

It will be appreciated by those skilled in the art that the invention is not limited to the triangular supply voltage signal waveform illustrated in FIG. 2. In other forms of the invention the waveform produced by the modulated supply voltage signal may comprise a more complex waveform. It should again be noted that the modulation waveform of the supply voltage signal and the modulation waveform of the clock frequency need not be identical within the scope of the present invention and the following claims. Rather, the modulation waveforms may be somewhat different. In some cases the waveform differences between the supply voltage modulation and the clock frequency modulation may improve power dissipation without loss of performance.

Many different arrangements may be employed to modulate the supply voltage signal in concert with the modulated spread spectrum clock frequency. The arrangements shown in FIGS. 1 and 3 are simply preferred embodiments for accomplishing the desired relative modulation between the supply voltage signal and clock frequency. Alternatively to the arrangements shown in FIGS. 1 and 3, a function generator may be associated with the power supply 15 and the function applied to control both the modulation of the supply voltage signal and the spread spectrum clock frequency. The desired relative modulation may also be accomplished with a passive distribution and decoupling network associated with circuit 10 which has a slightly negative impedance at the fundamental frequency of the spread spectrum modulation. These latter modulation arrangements are to be considered equivalent to those illustrated in the figures.

Furthermore, those skilled in the art will appreciate that the invention is not limited to the method of modulation or modulation introduction into clock source 14 or power supply 15 shown for purposes of example in FIGS. 1 and 3. In other forms of the invention, the spread spectrum frequency modulation could be accomplished before loop filter 22, and could take signal forms other than voltages. Such alternative signal forms include currents and digital representations translatable as phase error for the clock source and voltage for the power supply. In other forms of the invention, the modulation could be introduced into clock source 14, and a frequency-to-voltage converter at the output of clock source 14 could provide the modulation source for power supply 15. Any suitable modulation technique for producing corresponding modulation in the clock frequency and power supply voltage is to be considered equivalent to the techniques and arrangements specifically described in this disclosure.

The above described preferred embodiments are intended to illustrate the principles of the invention, but not to limit the scope of the invention. Various other embodiments and modifications to these preferred embodiments may be made by those skilled in the art without departing from the scope of the following claims.

What is claimed is:

1. An apparatus for controlling the system supply voltage in a system utilizing a spread spectrum clock signal, the apparatus including:
  (a) spread spectrum clock source having a modulation input;
  (b) a modulating arrangement including a modulation signal source having an output connected to the modulation input of the spread spectrum clock source, the modulating arrangement applying a first modulation to a clock signal frequency for the system, the first modulation varying the clock signal frequency about a nominal value for the clock signal frequency;
  (c) a corresponding modulating arrangement operatively connected to apply a corresponding modulation to a system supply voltage the corresponding modulation varying the system supply voltage about a nominal value for the system supply voltage.

2. The apparatus of claim 1 further including a power supply circuit having a reference input, and wherein the modulation signal source output is applied to modulate a signal at the reference input.

3. The apparatus of claim 2 further including a summing junction connected to sum a DC reference voltage and the modulation signal source output to produce a summed output and apply the summed output to the reference input of the power supply circuit.

4. The apparatus of claim 1 wherein the first modulation and the corresponding modulation comprise unequal waveforms.

5. A spread spectrum clock system including:
  (a) a spread spectrum clock source having a frequency modulation input and providing a clock signal;

(b) a power supply circuit providing a supply voltage output;

(c) a modulating arrangement including modulator connected to provide a modulate reference input to the power supply circuit, the modulating arrangement applying a first modulation to the supply voltage output, the first modulation varying the supply voltage output about a nominal value for the supply voltage output; and (d) a corresponding modulating arrangement operatively connected to apply the supply voltage output to produce a corresponding modulation in the frequency of the clock signal, the corresponding modulation varying the frequency of the clock signal about a nominal value for the frequency of the clock signal.

6. The apparatus of claim 5 further including:

(a) a signal translator connected to receive the supply voltage output and provide a translated output to the frequency modulation input of the spread spectrum clock source.

7. The apparatus of claim 5 wherein the first modulation waveform and the corresponding modulation waveform are unequal.

8. A method for providing a spread spectrum clock signal for a circuit, the method including the steps of:

(a) modulating a power supply signal for the circuit at a first modulation to vary the power supply signal about a nominal supply voltage;

(b) conditioning the modulated power supply signal for the circuit to produce a conditioned signal at the first modulation;

(c) applying the conditioned signal to a modulation input of a spread spectrum clock source circuit to modulate the frequency of the clock signal for the circuit at a corresponding modulation to vary the frequency of the clock signal about a nominal clock signal frequency.

9. The method of claim 8 wherein the step of modulating the power supply signal for the circuit includes the step of:

(a) modulating a reference voltage input to a power supply for the circuit.

10. The method of claim 8 wherein the first modulation waveform and the corresponding modulation waveform are unequal.

* * * * *

UNITED STATES PATENT AND TRADEMARK OFFICE
CERTIFICATE OF CORRECTION

| | |
|---|---|
| PATENT NO. | : 7,050,478 B1 |
| APPLICATION NO. | : 09/631716 |
| DATED | : May 23, 2006 |
| INVENTOR(S) | : Roger Donell Weekly |

Page 1 of 1

It is certified that error appears in the above-identified patent and that said Letters Patent is hereby corrected as shown below:

At column 6, line 39:
  Change "spread spectrum" to --a spread spectrum--.

At column 6, line 50:
  Change "voltage the" to --voltage, the--.

At column 7, line 3:
  Change "including modulator" to --including a modulator--.

At column 7, line 4:
  Change "modulate" to --modulated--.

Signed and Sealed this

Fifteenth Day of August, 2006

JON W. DUDAS
*Director of the United States Patent and Trademark Office*